(12) United States Patent
Akutsu et al.

(10) Patent No.: US 10,636,691 B2
(45) Date of Patent: Apr. 28, 2020

(54) SEMICONDUCTOR PROCESSING SHEET

(71) Applicant: LINTEC Corporation, Itabashi-ku (JP)

(72) Inventors: Takashi Akutsu, Saitama (JP); Takuo Nishida, Munich (DE)

(73) Assignee: LINTEC Corporation, Itabashi-ku (JP)

( * ) Notice: Subject to any disclaimer, the term of this patent is extended or adjusted under 35 U.S.C. 154(b) by 270 days.

(21) Appl. No.: 15/466,369

(22) Filed: Mar. 22, 2017

(65) Prior Publication Data

US 2017/0278739 A1 Sep. 28, 2017

(30) Foreign Application Priority Data

Mar. 28, 2016 (JP) .................................. 2016-063160

(51) Int. Cl.
*H01L 21/683* (2006.01)
*C09J 5/00* (2006.01)
(Continued)

(52) U.S. Cl.
CPC ............. *H01L 21/6836* (2013.01); *B32B 7/06* (2013.01); *B32B 7/12* (2013.01); *B32B 23/08* (2013.01); *B32B 25/08* (2013.01); *B32B 27/06* (2013.01); *B32B 27/08* (2013.01); *B32B 27/16* (2013.01); *B32B 27/286* (2013.01); *B32B 27/302* (2013.01); *B32B 27/304* (2013.01); *B32B 27/308* (2013.01); *B32B 27/32* (2013.01);
(Continued)

(58) Field of Classification Search
CPC ......... H01L 21/6836; H01L 2221/6834; H01L 2221/68327; B32B 23/08; B32B 7/06; B32B 7/12; B32B 27/40; B32B 27/365; B32B 27/36; B32B 27/325; B32B 27/32; B32B 27/308; B32B 27/304; B32B 27/302; B32B 27/286; B32B 27/27; B32B 27/08; B32B 27/06; B32B 25/08; B32B 2307/748; B32B 2307/732; B32B 2255/28; B32B 2255/26; B32B 2255/10; B32B 2250/24; B32B 2250/02; B32B 2457/14; C08L 33/08; C09J 7/22; C09J 7/38; C09J 133/26; C09J 133/064; C09J 133/08; C09J 5/00; C09J 2205/31; C09J 2205/302; C09J 2203/326; C09J 2201/622; C09J 2201/606; C09J 2433/00
See application file for complete search history.

(56) References Cited

U.S. PATENT DOCUMENTS

2008/0027179 A1* 1/2008 Zollner ................. C08F 220/18
525/222
2008/0057216 A1* 3/2008 Shintani ..................... C09J 7/22
427/487
2013/0289210 A1* 10/2013 Miki ....................... C09J 139/06
525/103

FOREIGN PATENT DOCUMENTS

WO WO 2015/111310 A1 7/2015

* cited by examiner

Primary Examiner — Michael Zhang
(74) Attorney, Agent, or Firm — Oblon, McClelland, Maier & Neustadt, L.L.P.

(57) ABSTRACT

The semiconductor processing sheet of the present invention is a semiconductor processing sheet including a base material and a pressure sensitive adhesive layer provided on one surface of the base material, wherein the pressure sensitive adhesive layer contains an acrylic polymer (A) having a molecular weight distribution of 3.0 or less and an acrylic polymer (B) having a molecular weight distribution of more than 3.0; and a gel fraction of the pressure sensitive adhesive layer is 50 to 70%, and a number average molecular weight of a sol content thereof is 60,000 or more.

11 Claims, 1 Drawing Sheet

(51) Int. Cl.
*C08L 33/08* (2006.01)
*B32B 25/08* (2006.01)
*C09J 133/26* (2006.01)
*C09J 7/22* (2018.01)
*B32B 27/32* (2006.01)
*B32B 27/30* (2006.01)
*B32B 7/06* (2019.01)
*C09J 7/38* (2018.01)
*B32B 23/08* (2006.01)
*B32B 27/36* (2006.01)
*C09J 133/06* (2006.01)
*B32B 27/08* (2006.01)
*B32B 27/28* (2006.01)
*B32B 27/40* (2006.01)
*B32B 27/16* (2006.01)
*B32B 7/12* (2006.01)
*B32B 27/06* (2006.01)
*C09J 133/08* (2006.01)

(52) U.S. Cl.
CPC ............ *B32B 27/325* (2013.01); *B32B 27/36* (2013.01); *B32B 27/365* (2013.01); *B32B 27/40* (2013.01); *C08L 33/08* (2013.01); *C09J 5/00* (2013.01); *C09J 7/22* (2018.01); *C09J 7/38* (2018.01); *C09J 133/064* (2013.01); *C09J 133/08* (2013.01); *C09J 133/26* (2013.01); *B32B 2250/02* (2013.01); *B32B 2250/24* (2013.01); *B32B 2255/10* (2013.01); *B32B 2255/26* (2013.01); *B32B 2255/28* (2013.01); *B32B 2307/732* (2013.01); *B32B 2307/748* (2013.01); *B32B 2457/14* (2013.01); *C09J 2201/606* (2013.01); *C09J 2201/622* (2013.01); *C09J 2203/326* (2013.01); *C09J 2205/302* (2013.01); *C09J 2205/31* (2013.01); *C09J 2433/00* (2013.01); *H01L 2221/6834* (2013.01); *H01L 2221/68327* (2013.01)

SEMICONDUCTOR PROCESSING SHEET

FIELD OF THE INVENTION

The present invention relates to a semiconductor processing sheet, and in more detail, the present invention relates to a back grind sheet which is used upon being stuck onto a front face of a semiconductor wafer at the time of wafer back grinding.

BACKGROUND OF THE INVENTION

While an information terminal apparatus is rapidly becoming thinner, smaller, and more multifunctional, a semiconductor which is mounted thereon is also demanded to become further thinner and to have higher density. In order to make the device further thinner, it is also demanded to make a semiconductor wafer on which the semiconductor is integrated further thinner. Therefore, the backside of the semiconductor wafer is often ground and made thinner.

In addition, a bump (or electrode) formed of solder or the like is formed on the front face of the wafer, and unevenness is frequently provided thereon. When such a bump-provided semiconductor wafer is subjected to back grinding, in order to protect the front face that has bump portions, a semiconductor processing sheet is stuck onto the front face of the wafer. Hitherto, as the semiconductor processing sheet, it is general to use a pressure sensitive adhesive sheet including a base material and a pressure sensitive adhesive layer provided on one surface of the base material.

In order to appropriately protect the uneven portions, such as bumps, etc., existing on the front face of the wafer, the aforementioned semiconductor processing sheet is demanded to have embedding properties to a bump or followability to unevenness. In addition, if the pressure sensitive adhesive of the semiconductor processing sheet remains in the unevenness, a fault is liable to be generated in the semiconductor device due to a residue of the pressure sensitive adhesive. Therefore, for example, PTL 1 discloses that in order to suppress the residue of the pressure sensitive adhesive in the unevenness while increasing the followability to unevenness, in the semiconductor processing sheet, an intermediate layer and a pressure sensitive adhesive layer are provided on a base material, and the intermediate layer and the pressure adhesive layer are each formed of a specified acrylic polymer.

CITATION LIST

Patent Literature

PTL 1; WO 2015/111310 A

SUMMARY OF THE INVENTION

In recent years, in the semiconductor device, it is contemplated to achieve much more miniaturization, and even a fine stain on the semiconductor wafer is liable to generate a fault in the semiconductor device. Therefore, it is likely to be demanded that even a slight residue which cannot be confirmed through visual inspection is not generated. For example, a stain-like residue which cannot be observed unless using an electron microscope often remains in the periphery of a bump; and reduction of such a residue is demanded.

Although the semiconductor processing sheet described in PTL 1 is able to reduce a residue of the pressure sensitive adhesive while making embedding properties to a bump favorable, it is difficult to appropriately suppress the aforementioned stain-like residue.

Then, in view of the foregoing problems, the present invention has been made. A problem of the present invention is to provide a semiconductor processing sheet which is able to suppress a stain-like residue remaining on a semiconductor wafer while making embedding properties to unevenness of a semiconductor wafer favorable.

The present inventors made investigations regarding a causing factor of the stain-like residue. As a result, they found that when the semiconductor processing sheet is released from the semiconductor wafer, a pressure sensitive adhesive component having a relatively low molecular weight remains in the periphery of the bump to form the stain-like residue. Then, the present inventors further made extensive and intensive investigations. As a result, it has been found that in order to prevent generation of the stain-like residue while making the embedding properties against unevenness of the semiconductor wafer favorable, it is necessary to use two kinds of acrylic polymers having a different molecular weight distribution from each other in the pressure sensitive adhesive layer and to set a gel fraction of the pressure sensitive adhesive layer and a number average molecular weight of a sol content to specified ranges, respectively, leading to accomplishment of the present invention.

Specifically, the present invention provides the following (1) to (13).

(1) A semiconductor processing sheet including: a base material, and a pressure sensitive adhesive layer provided on a surface of the base material, wherein the pressure sensitive adhesive layer contains an acrylic polymer (A) having a molecular weight distribution of 3.0 or less and an acrylic polymer (B) having a molecular weight distribution of more than 3.0; and a gel fraction of the pressure sensitive adhesive layer is 50 to 70%, and a number average molecular weight of a sol content thereof is 60,000 or more.

(2) The semiconductor processing sheet as set forth in the above item (1), wherein the pressure sensitive adhesive layer is composed of one or more layers, and an outermost layer of the pressure sensitive adhesive layer is energy ray-curable.

(3) The semiconductor processing sheet as set forth in the above item (2), wherein the outermost layer contains the acrylic polymer (B), and the acrylic polymer (B) in the outermost layer is energy ray-curable.

(4) The semiconductor processing sheet as set forth in any one of the above items (1) to (3), wherein the semiconductor processing sheet is stuck onto a front face of a semiconductor wafer on which a bump is provided; and a thickness of the pressure sensitive adhesive layer is 1.0 time or more of a height of the bump.

(5) The semiconductor processing sheet as set forth in any one of the above items (1) to (4), wherein the acrylic polymer (A) is an acrylic copolymer (a) resulting from copolymerization of at least an alkyl (meth)acrylate (a1) and a functional group-containing monomer (a2).

(6) The semiconductor processing sheet as set forth in the above item (5), wherein the functional group-containing monomer (a2) is a monomer containing a carboxyl group.

(7) The semiconductor processing sheet as set forth in any one of the above items (1) to (6), wherein the acrylic polymer (B) contains an acrylic copolymer (b) resulting from copolymerization of at least an alkyl (meth)acrylate (b1) and a functional group-containing monomer (b2), or an energy ray-curable acrylic polymer (Be) having an energy ray-polymerizable group introduced into a side chain of the acrylic copolymer (b).

(8) The semiconductor processing sheet as set forth in any one of the above items (1) to (7), wherein a weight average molecular weight of the acrylic polymer (A) is 150,000 or more, and a weight average molecular weight of the acrylic polymer (B) is 150,000 or more.

(9) The semiconductor processing sheet as set forth in any one of the above items (1) to (8), wherein the pressure sensitive adhesive layer has a layer containing the acrylic polymer (A) and the acrylic polymer (B).

(10) The semiconductor processing sheet as set forth in the above (9), wherein
the pressure sensitive adhesive layer includes an outermost layer and an inside layer provided in the inside of the outermost layer; and
the inside layer is a layer containing the acrylic polymer (A) and the acrylic polymer (B).

(11) The semiconductor processing sheet as set forth in any one of the above items (1) to (10), wherein the pressure sensitive adhesive layer is composed of a single layer.

(12) The semiconductor processing sheet as set forth in any one of the above items (1) to (11), which is a back grind sheet.

(13) A method of producing a semiconductor processing sheet, the method including: forming a pressure sensitive adhesive layer on a surface of a base material, wherein
the pressure sensitive adhesive layer is blended with at least an acrylic polymer (A) obtained through living radical polymerization and an acrylic polymer (B) obtained through free radical polymerization such that a gel fraction of the pressure sensitive adhesive layer is 50 to 70%, and a number average molecular weight of a sol content thereof is 60,000 or more.

In the present invention, a semiconductor processing sheet which is able to suppress generation of a stain-like residue remaining on a workpiece, such as a semiconductor wafer, etc., while making embedding properties to unevenness of the workpiece favorable, can be provided.

DETAILED DESCRIPTION OF THE INVENTION

Figure 1:
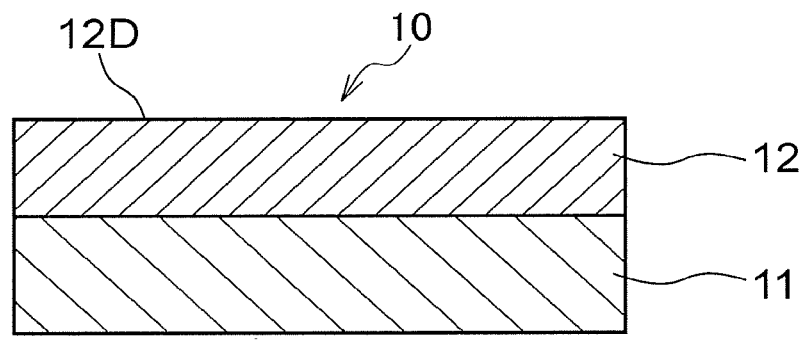
FIG. 1 is a cross-sectional view showing an embodiment of a semiconductor processing sheet.
Figure 2:
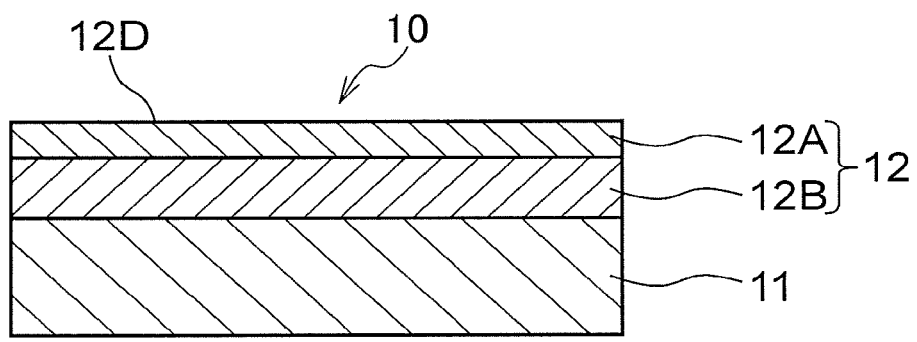
FIG. 2 is a cross-sectional view showing another embodiment of a semiconductor processing sheet.

As shown in FIGS. 1 and 2, a semiconductor processing sheet 10 of the present invention includes a base material 11 and a pressure sensitive adhesive layer 12 provided on one surface of the base material 11. The pressure sensitive adhesive layer 12 is one composed of one or more layers. In consequence, though the pressure sensitive adhesive layer 12 may be composed of a single layer as shown in FIG. 1, it may also be composed of plural layers as shown in FIG. 2. In the case where the pressure sensitive adhesive layer 12 is composed of plural layers, the pressure sensitive adhesive layer 12 includes an outermost layer 12A constituting an outermost surface 12D (e.g. adhesive surface) of the pressure sensitive adhesive 12 and an inside layer 12B provided more inside than the outermost layer 12A. In FIG. 2, the inside layer 12B is composed of one layer, and the pressure sensitive adhesive layer 12 is constituted of two layers; however, the inside layer 12B may also be composed of plural layers, so that the pressure sensitive adhesive layer 12 is constituted of three or more layers. In addition, as shown in FIG. 1, in the case where the pressure sensitive adhesive layer 12 is composed of a single layer, the single-layered pressure sensitive adhesive layer 12 constitutes the outermost layer having the outermost surface 12D.

The semiconductor processing sheet 10 may also be protected by a release material, the release material being stuck onto the outermost surface 12D.

Each structure of the semiconductor processing sheet is hereunder described in detail.

<Pressure Sensitive Adhesive Layer>

The pressure sensitive adhesive layer contains an acrylic polymer (A) having a molecular weight distribution (Mw/Mn) of 3.0 or less and an acrylic polymer (B) having a molecular weight distribution of more than 3.0, in which a gel fraction thereof is 50 to 70%, and a number average molecular weight (Mn) of a sol content thereof is 60,000 or more.

In the present invention, by using the acrylic polymers (A) and (B) having a different molecular weight distribution from each other in this way, it becomes possible to increase the number average weight of the sol content of the pressure sensitive adhesive layer while setting the gel fraction to a predetermined range. Therefore, a stain-like residue is made hard to remain in a workpiece onto which the semiconductor processing sheet is stuck while making the embedding properties to unevenness of the workpiece favorable.

On the other hand, in the pressure sensitive adhesive layer, when the gel fraction is less than 50%, or the number average molecular weight of the sol content is less than 60,000, the stain-like residue is liable to be generated in a workpiece, such as a semiconductor wafer, etc. In addition, when the gel fraction is higher than 70%, the embedding properties to unevenness of the pressure sensitive adhesive layer are liable to be worsened.

Measurement methods of the gel fraction, and the number average molecular weight of the sol content are those mentioned later. In the case where the pressure sensitive adhesive layer is composed of plural layers, the gel fraction, and the number average molecular weight of the sol content are those measured with respect to the whole of the pressure sensitive adhesive layer composed of plural layers.

In the present specification, the weight average molecular weight (Mw) and the number average molecular weight (Mn) are values converted into polystyrene to be measured by the gel permeation chromatography (GPC), and specifically, values measured on the basis of the methods described in the Examples. Furthermore, the molecular weight distribution (Mw/Mn) is a numerical value determined from {weight average molecular weight (Mw)}/{number average molecular weight (Mn)}.

In the case where the pressure sensitive adhesive layer is composed of a single layer as mentioned above, the pressure sensitive adhesive layer composed of a single layer contains both the aforementioned polymer (A) and polymer (B). Meanwhile, in the case where the pressure sensitive adhesive layer is constituted of two or more layers, the polymer (A) and the polymer (B) have only to be contained as the whole of the pressure sensitive adhesive layer. That is, each of those layers may not contain either of the polymer (A) and the polymer (B).

In the case where the pressure sensitive adhesive layer is constituted of two or more layers, though a layer not containing either of the polymer (A) and the polymer (B)

may be provided as mentioned above, in general, each of those layers contains at least either one of the polymer (A) and the polymer (B). In addition, it is preferred that at least one layer contains both the polymer (A) and the polymer (B).

In order to make the embedding properties of the pressure sensitive adhesive layer more favorable, the gel fraction is preferably 50 to 66%. In addition, in order to make it hard to generate the stain-like residue while making the embedding properties favorable, the number average molecular weight (Mn) of the sol content of the pressure sensitive adhesive layer is preferably 65,000 to 150,000, and more preferably 68,000 to 120,000.

It is preferred that the molecular weight distribution of the acrylic polymer (A) is 1 to 3, and the molecular weight distribution of the acrylic polymer (B) is 3.2 to 8. Furthermore, it is more preferred that the molecular weight distribution of the acrylic polymer (A) is 1.2 to 2.8, and the molecular weight distribution of the acrylic polymer (B) is 3.5 to 6.

When the molecular weight distributions of the acrylic polymers (A) and (B) fall within the foregoing ranges, it becomes easy to regulate the gel fraction of the pressure sensitive adhesive layer and the number molecular weight of the sol content thereof to suitable ranges. Then, the stain-like residue is made harder to generate while making the embedding properties favorable.

In the present invention, it is preferred that not only a weight average molecular weight (Mw) of the acrylic polymer (A) is 150,000 or more, but also a weight average molecular weight (Mw) of the acrylic polymer (B) is 150,000 or more. When the weight average molecular weights of the polymers (A) and (B) are 150,000 or more, it becomes easy to regulate the number average molecular weight of the sol content to 60,000 or more. Furthermore, it becomes easy to secure various performances that are considered needed for the pressure sensitive adhesive.

It is more preferred that not only the weight average molecular weight of the acrylic polymer (A) is 150,000 to 1,000,000, but also the weight average molecular weight of the acrylic polymer (B) is 150,000 to 1,000,000. It is still more preferred that not only the weight average molecular weight of the acrylic polymer (A) is 180,000 to 800,000, but also the weight average molecular weight of the acrylic polymer (B) is 200,000 to 500,000.

In the present invention, by allowing the weight average molecular weights of the polymers (A) and (B) to fall within the foregoing ranges, it becomes easy to regulate the gel fraction and the number average molecular weight of the sol content to suitable values. Then, the stain-like residue is made harder to generate while making the embedding properties to unevenness of the pressure sensitive adhesive layer favorable.

Next, the acrylic polymers (A) and (B) which are used for the pressure sensitive adhesive layer are described in more detail.

(Acrylic Polymer (A))

Although the acrylic polymer (A) can be produced through various combinations of monomers, it is preferred to use an acrylic copolymer (a) resulting from copolymerization of at least an alkyl (meth)acrylate (a1) and a functional group-containing monomer (a2).

As the alkyl (meth)acrylate (a1), an alkyl (meth)acrylate having an alkyl group having 1 to 18 carbon atoms is exemplified; an alkyl (meth)acrylate having an alkyl group having 1 to 8 carbon atoms is preferably exemplified; and an alkyl (meth)acrylate having an alkyl group having 1 to 4 carbon atoms is more preferably exemplified.

Examples of the alkyl (meth)acrylate (a1) include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-pentyl (meth)acrylate, n-hexyl (meth)acrylate, 2-ethylhexyl (meth)acrylate, isooctyl (meth)acrylate, n-octyl (meth)acrylate, and the like.

In the acrylic copolymer (a), the alkyl (meth)acrylate (a1) may be used singly or in combination of two or more.

The content of the constituting unit derived from the alkyl (meth)acrylate (a1) in the acrylic copolymer (a) is preferably 50 to 99 mass %, more preferably 65 to 97 mass %, and still more preferably 75 to 90 mass %.

The term "(meth)acrylate" as referred to in the present specification is used as a terminology indicating both "acrylate" and "methacrylate", and the same is also applicable to other analogous terminologies.

The functional group-containing monomer (a2) is a monomer containing a reactive functional group. The reactive functional group is a functional group capable of reacting with other compound, such as a crosslinking agent (C), an unsaturated group-containing compound (X), etc. In view of the fact that the acrylic copolymer (a) has a constituting unit derived from the functional group-containing monomer (a2), the acrylic copolymer (a) becomes possible to be crosslinked with a crosslinking agent (C) as mentioned later. Furthermore, by bonding to an unsaturated group-containing compound (X) as mentioned later, it also becomes possible to introduce an energy ray-polymerizable group into a side chain thereof.

Specifically, examples of the reactive functional group include a hydroxyl group, a carboxyl group, an epoxy group, and the like. Among these, a carboxyl group is more preferred because it has good reactivity with the crosslinking agent (C) and is easy to improve the aforementioned embedding properties.

Examples of the functional group-containing monomer (a2) include hydroxyl group-containing (meth)acrylates, such as hydroxymethyl (meth)acrylate, 2-hydroxyethyl (meth)acrylate. 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, etc.; unsaturated alcohols, such as vinyl alcohol, allyl alcohol, etc.; epoxy group-containing (meth)acrylates, such as glycidyl (meth)acrylate. β-methylglycidyl (meth)acrylate, (3,4-epoxycyclohexyl)methyl (meth)acrylate, 3-epoxycyclo-2-hydroxypropyl (meth)acrylate, etc.; non-acrylic epoxy group-containing monomers, such as glycidyl crotonate, allyl glycidyl ether, etc.; ethylenically unsaturated carboxylic acids, such as acrylic acid, methacrylic acid, crotonic acid, maleic acid, itaconic acid, citraconic acid, etc.; and the like.

In the acrylic copolymer (a), the functional group-containing monomer (a2) may be used singly or in combination of two or more.

Among these, from the viewpoints of reactivity with the crosslinking agent (C) and embedding properties, ethylenically unsaturated carboxylic acids are preferred; and above all, acrylic acid and methacrylic acid are more preferred, with acrylic acid being still more preferred.

The content of the constituting unit derived from the functional group-containing monomer (a2) is preferably 0.5 to 30 mass %, more preferably 1 to 25 mass %, and still more preferably 1 to 20 mass % relative to all of the constituting units of the acrylic copolymer (a).

The acrylic copolymer (a) is preferably one resulting from further copolymerization of, in addition to the aforementioned components (a1) and (a2), an acrylamide compound (a3).

In view of the fact that the acrylic copolymer (a) has a constituting unit derived from the acrylamide compound (a3), the embedding properties and so on are easily made favorable.

Examples of the acrylamide compound (a3) include acrylamide, N-methyl (meth)acrylamide, N-ethyl (meth)acrylamide, N-isopropyl (meth)acrylamide, N,N-dimethyl (meth)acrylamide, N,N-diethyl (meth)acrylamide, and the like. Among these, N,N-substituted (meth)acrylamides are preferred, and N,N-dialkyl (meth)acrylamides, such as N,N-dimethyl (meth)acrylamide, N,N-diethyl (meth)acrylamide, etc., are more preferred.

In the acrylic copolymer (a), the acrylamide compound (a3) may be used singly or in combination of two or more.

The content of the constituting unit derived from the (meth)acrylamide compound (a3) in the acrylic copolymer (a) is preferably 1 to 30 mass %, more preferably 5 to 25 mass %, and still more preferably 10 to 20 mass %.

The acrylic copolymer (a) may also be one resulting from further copolymerization of, in addition to the aforementioned components (a1) and (a2) or components (a1) to (a3), other monomer (a4). The other monomer (a4) means a copolymerizable monomer other than the aforementioned (a1) to (a3) components. Specifically, examples thereof include (meth)acrylates having a cyclic skeleton, such as a cycloalkyl (meth)acrylate in which a cycloalkyl group thereof has 3 to 20 carbon atoms, benzyl (meth)acrylate, isobornyl (meth)acrylate, dicyclopentanyl (meth)acrylate, dicyclopentenyl (meth)acrylate, dicyclopentenyloxyethyl (meth)acrylate, etc.; vinyl ester compounds, such as vinyl acetate, vinyl propionate, etc.; olefins, such as ethylene, propylene, isobutylene, etc.; halogenated olefins, such as vinyl chloride, vinylidene chloride, etc.; styrene-based monomers, such as styrene, α-methylstyrene, etc.; diene-based monomers, such as butadiene, isoprene, chloroprene, etc.; nitrile-based monomers, such as acrylonitrile, methacrylonitrile, etc.; and the like.

In the acrylic copolymer (a), the other monomer (a4) may be used singly or in combination of two or more.

The content of the constituting unit derived from the other monomer (a4) in the acrylic copolymer (a) is preferably 30 mass % or less, more preferably 20 mass % or less, and still more preferably 10 mass % or less.

As mentioned above, the acrylic polymer (A) has a relatively small molecular weight distribution in the present invention, and by using the polymer (A), the stain-like residue is easily suppressed.

The acrylic polymer (A) may also be energy ray-curable. In the case where the acrylic polymer (A) is energy ray-curable, more specifically, an energy ray-curable acrylic polymer (Ae) having an energy ray-polymerizable group introduced into a side chain of the above-mentioned acrylic copolymer (a) is used. As a method of introducing an energy ray-polymerizable group into a side chain, similar to an energy ray-curable acrylic polymer (Be) as mentioned later, it is preferred to bond an unsaturated group-containing compound (X) as mentioned later to the reactive functional group of the functional group-containing monomer (a2).

However, the acrylic polymer (A) is preferably a non-energy ray-curable acrylic polymer. The non-energy ray-curable acrylic polymer (A) is a polymer in which an energy ray-polymerizable group is not introduced into a side chain thereof and in general, is composed of the acrylic copolymer (a). When the polymer (A) is made non-energy ray-curable, it becomes easy to make the embedding properties favorable.

In the case where the acrylic polymer (A) is energy ray-curable, and the acrylic copolymer (a) is used, all of the acrylic copolymer (a) may be made of the energy ray-curable acrylic polymer (Ae), or a part of the acrylic copolymer (a) may be made of the energy ray-curable acrylic polymer (Ae).

The energy ray means a ray having an energy quantum among electromagnetic waves or charged particle rays, and examples thereof include an ultraviolet ray, an electron beam, and the like.

In order to allow the acrylic polymer (A) to have a narrow molecular weight distribution as mentioned above, it is preferred that the acrylic polymer (a) is produced thought living radical polymerization. The living radical polymerization is radical polymerization in which the activity of a polymerization terminal is maintained without being lost. Examples thereof include atom transfer radical polymerization (ATRP polymerization) using an organic halide or the like as an initiator (ATRP initiator) and a transition metal complex as a catalyst; reversible addition fragmentation chain transfer polymerization (RAFT polymerization) in which polymerization is performed in the presence of an RAFT initiator; and the like. Among these, ATRP polymerization and RAFT polymerization are preferred.

Examples of the ATRP initiator which is used for the ATRP polymerization include α-bromostyrene.

Examples of the RAFT initiator include bis(thiocarbonyl) disulfides, such as bis(thiobenzoyl) disulfide, bis(dodecylsulfanylthiocarbonyl) disulfide, etc.; trithiocarbonates, such as 2-cyano-2-propyl-dodecyl trithiocarbonate, 4-cyano-4-[(dodecylsulfanylthiocarbonyl)sulfanyl]pentanoic acid, cyanomethyldodecyl trithiocarbonate, etc.; aromatic dithioesters, such as 2-cyano-2-propylbenzodithioate, 2-phenyl-2-propylbenzodithioate, etc. Among these, bis(thiocarbonyl) disulfides, such as bis(thiobenzoyl) disulfide, bis(dodecylsulfanylthiocarbonyl) disulfide, etc., are preferred.

(Acrylic Polymer (B))

Although the acrylic polymer (B) can be produced through various combinations of monomers, it is preferred to use an acrylic copolymer (b) resulting from copolymerization of at least an alkyl (meth)acrylate (b1) and a functional group-containing monomer (b2).

As the alkyl (meth)acrylate (b1), an alkyl (meth)acrylate having an alkyl group having 1 to 18 carbon atoms is exemplified; an alkyl (meth)acrylate having an alkyl group having 1 to 8 carbon atoms is preferably exemplified; and an alkyl (meth)acrylate having an alkyl group having 1 to 4 carbon atoms is more preferably exemplified.

As the alkyl (meth)acrylate (b1), it is possible to use a variety of the alkyl (meth)acrylates which are enumerated as the usable compound for the alkyl (meth)acrylate (a1).

As the alkyl (meth)acrylate (b1), one selected from those mentioned above in the acrylic copolymer (b) may be used, or a combination of two or more thereof may also be used.

The content of the constituting unit derived from the alkyl (meth)acrylate (b1) in the acrylic copolymer (b) is preferably 50 to 99 mass %, more preferably 65 to 97 mass %, and still more preferably 75 to 90 mass %.

The functional group-containing monomer (b2) is a monomer containing a reactive functional group. The reactive functional group is a functional group capable of reacting with other compound, such as an unsaturated group-containing compound (X), a crosslinking agent (C), etc. In view of the fact that the acrylic copolymer (b) has a constituting unit derived from the functional group-containing monomer (b2), it becomes possible to be crosslinked with the crosslinking agent (C) as mentioned later. Furthermore, by bonding to the unsaturated group-containing compound (X) as mentioned later, it also becomes possible to introduce an energy ray-polymerizable group into a side chain of the acrylic polymer (B).

Specifically, examples of the reactive functional group include a hydroxyl group, a carboxyl group, an epoxy group, and the like. Among these, a hydroxyl group is more preferred because it is excellent in reactivity with the unsaturated group-containing compound (X) and the crosslinking agent (C).

As the functional group-containing monomer (b2), it is possible to use a variety of the functional group-containing monomers which are enumerated as the usable monomer for the functional group-containing monomer (a2). As the functional group-containing monomer (b2), one selected from those mentioned above may be used, or a combination of two or more thereof may also be used in the acrylic copolymer (b).

Among those mentioned above, a hydroxyl group-containing (meth)acrylate is preferred, and 2-hydroxyethyl (meth)acrylate is more preferred as the functional group-containing monomer (b2) from the standpoint of excellent reactivity with the unsaturated group-containing compound (X) and the crosslinking agent (C) as mentioned later.

The content of the constituting unit derived from the functional group-containing monomer (b2) in the acrylic copolymer (b) is preferably 0.5 to 30 mass %, more preferably 5 to 25 mass %, and still more preferably 10 to 20 mass %.

The acrylic copolymer (b) may also be one resulting from further copolymerization of, in addition to the aforementioned components (b1) and (b2), other monomer component (b3) than the components (b1) and (b2).

As the other monomer component (b3), it is possible to use a variety of the acrylamide compounds enumerated above for the component (a3) and a variety of the monomers enumerated above for the other monomer (a4). As the other monomer (b3), one selected from those may be used, or a combination of two or more thereof may also be used in the acrylic copolymer (b).

The content of the constituting unit derived from the other monomer (b3) in the acrylic copolymer (b) is preferably 30 mass % or less, more preferably 20 mass % or less, and still more preferably 10 mass % or less.

In the present invention, by using the polymer (B) having a relatively large molecular weight distribution, the embedding properties and so on are easily made favorable.

It is preferred that the acrylic polymer (B) is energy ray-curable. In the case where the acrylic polymer (B) is energy ray-curable, more specifically, an energy ray-curable acrylic polymer (Be) in which an energy ray-polymerizable group is introduced into a side chain of the above-mentioned acrylic copolymer (b) is used. As a method of introducing an energy ray-polymerizable group into a side chain, it is preferred to bond an unsaturated group-containing compound (X) as mentioned later to the reactive functional group of the functional group-containing monomer (b2).

In the case where the acrylic polymer (B) is energy ray-curable, and the acrylic copolymer (b) is used, though all of the acrylic copolymer (b) may be made of the energy ray-curable acrylic polymer (Be), a part of the acrylic copolymer (b) may also be made of the energy ray-curable acrylic polymer (Be).

In the case where the acrylic polymer (B) is non-energy ray-curable, the acrylic polymer (B) is, in general, composed of the acrylic copolymer (b).

As mentioned above, though the polymer (A) and the polymer (B) may be each either non-energy ray-curable or energy ray-curable, in order to make releasability on releasing the semiconductor processing sheet from a workpiece favorable while making the embedding properties favorable, it is more preferred that the polymer (A) is non-energy ray-curable, whereas the polymer (B) is energy ray-curable.

In the case where either or both of the polymer (A) and the polymer (B) are energy ray-curable, and the pressure sensitive adhesive layer is composed of a single layer, the single-layered pressure sensitive adhesive layer becomes energy ray-curable. On the other hand, in the case where the pressure sensitive adhesive layer is composed of plural layers, though the pressure sensitive adhesive layer may include both an energy ray-curable layer and a non-energy ray-curable layer that is not curable with an energy ray, it is preferred that all of the layers are energy ray-curable.

Although a method of producing the acrylic copolymer (b) is not limited so long as it is a method in which a polymer having the aforementioned molecular weight distribution can be produced, it is preferred to produce the acrylic copolymer (b) through free radical polymerization. For example, in the free radical polymerization, the acrylic copolymer (b) can be obtained by polymerizing a monomer working as a raw material of the acrylic copolymer (b) in the presence of a polymerization initiator selected from persulfates, such as potassium persulfate, ammonium persulfate, etc.; azo-based compounds, such as 2,2'-azobisisobutyronitrile, 2,2'-azobis(2,4-dimethylvaleronitrile), etc.; peroxides, such as hydrogen peroxide, benzoyl peroxide, lauryl peroxides, etc.; redox-based compounds composed of a combination of ammonium persulfate with sodium sulfite, acidic sodium sulfite, etc.; and the like. Among these, azo-based compounds are preferably used as the polymerization initiator.

In the free radical polymerization, in order to control the degree of polymerization, a chain transfer agent, such as an alkyl mercaptan, e.g., octyl mercaptan, nonyl mercaptan, decyl mercaptan, dodecyl mercaptan, etc., a thioglycolic acid ester, e.g., octyl thioglycolate, nonyl thioglycolate, 2-ethylhexyl thioglycolate, 2-ethylhexyl β-mercaptopropionate, etc., 2,4-diphenyl-4-methyl-1-pentene, 1-methyl-4-isopropylidene-1-cyclohexene, etc., may be allowed to exist together with the polymerization initiator.

Among these, a thioglycolic acid ester, 2,4-diphenyl-4-methyl-1-pentene, and 1-methyl-4-isopropylidene-1-cyclohexene are preferred as the chain transfer agent.

(Unsaturated Group-Containing Compound (X))

The unsaturated group-containing compound (X) is a compound having a functional group capable of reacting with the aforementioned reactive functional group and an energy ray-polymerizable group. Examples of the energy ray-polymerizable group include those having a carbon-carbon double bond, such as a (meth)acryloyl group, a vinyl group, an allyl group, etc. Among these, a (meth)acryloyl group is preferred. Examples of the functional group capable of reacting with the reactive functional group include an isocyanate group, an epoxy group, and a carboxyl group. Among these, an isocyanate group is preferred.

That is, the unsaturated group-containing compound (X) is preferably a compound having an isocyanate group and a (meth)acryloyl group.

Specific examples of the unsaturated group-containing compound (X) include (meth)acryloyloxyethyl isocyanate, (meth)acryloyloxypropyl isocyanate, glycidyl (meth)acrylate, 1,1-(bisacryloyloxymethyl)ethyl isocyanate, and the like. Among these, (meth)acryloyloxyethyl isocyanate is preferred.

In the acrylic polymer (B), it is preferred that 45 to 95 mol % of the reactive functional group of the acrylic copolymer (b) reacts with the unsaturated group-containing compound (X). When 95 mol % or less of the reactive functional group reacts with the unsaturated group-containing compound (X), a certain amount of the reactive functional group remains without reacting, and it becomes possible to make the content of a crosslinking point upon being crosslinked with the crosslinking agent (C) relatively high. When 45 mol % or more of the reactive functional group reacts with the unsaturated group-containing compound (X), it becomes possible to introduce a sufficient amount of the unsaturated group into the acrylic polymer (B). Therefore, it becomes easy to make the energy ray curability of the pressure sensitive adhesive layer favorable.

From such viewpoints, it is preferred that 60 to 90 mol % of the reactive functional group reacts with the unsaturated group-containing compound (X), and it is more preferred that 65 to 85 mol % of the reactive functional group reacts with the unsaturated group-containing compound (X).

(Crosslinking Agent (C))

The pressure sensitive adhesive layer of the present invention is preferably one having the crosslinking agent (C) blended therein. The crosslinking agent (C) is crosslinked with either one or both of the polymer (A) and the polymer (B) in each layer of the pressure sensitive adhesive layer, thereby forming a crosslinking structure.

When crosslinked with the crosslinking agent (C), it becomes easy to improve cohesion, mechanical strength, heat resistance, and so on of the pressure sensitive adhesive layer. Examples of the crosslinking agent (C) include an organic polyvalent isocyanate compound, an organic polyvalent epoxy compound, an organic polyvalent imine compound, a metal chelate-based crosslinking agent, and the like. From the standpoint of high reactivity, an organic polyvalent isocyanate compound is preferred.

In the case where the pressure sensitive adhesive layer is composed of a single layer, the crosslinking agent (C) is blended in the pressure sensitive adhesive layer composed of a single layer. In the case where the pressure sensitive adhesive layer is composed of two or more layers, though the crosslinking agent (C) may be blended in a part of the layers, it is more preferred that the crosslinking agent (C) is blended in all of the layers.

Examples of the organic polyvalent isocyanate compound may include an aromatic polyvalent isocyanate compound, an aliphatic polyvalent isocyanate compound, an alicyclic polyvalent isocyanate compound, and a trimer, an isocyanurate, or an adduct of such an organic polyvalent isocyanate compound, an isocyanate-terminated urethane prepolymer obtained through reaction of an organic polyvalent isocyanate component with a polyol compound, and the like.

Specific examples of the organic polyvalent isocyanate compound include tolylene diisocyanate-based compounds, such as 2,4-tolylene diisocyanate, 2,6-tolylene diisocyanate, etc.; xylylene diisocyanate-based compounds, such as 1,3-xylylene diisocyanate, 1,4-xylylene diisocyanate, etc.; diphenylmethane diisocyanate-based compounds, such as diphenylmethane-4,4'-diisocyanate, diphenylmethane-2,4'-diisocyanate, etc.; dicyclohexylmethane diisocyanate-based compounds, such as dicyclohexylmethane-4,4'-diisocyanate, dicyclohexylmethane-2,4'-diisocyanate, etc.; 3-methyldiphenylmethane diisocyanate, hexamethylene diisocyanate, isophorone diisocyanate, lysine isocyanate, and the above-enumerated derivatives obtained therefrom; and the like.

Specific examples of the adduct include adducts with a low-molecular weight active hydrogen-containing compound, such as ethylene glycol, propylene glycol, neopentyl glycol, trimethylolpropane, castor oil, etc. For example, there are exemplified trimethylolpropane adduct xylylene diisocyanate, trimethylolpropane adduct tolylene diisocyanate, and the like.

Specific examples of the organic polyvalent epoxy compound include 1,3-bis(N,N'-diglycidylaminomethyl)cyclohexane, N,N,N',N'-tetraglycidyl-m-xylylenediamine, ethylene glycol diglycidyl ether, 1,6-hexanediol diglycidyl ether, trimethylolpropane diglycidyl ether, diglycidylaniline, diglycidylamine, and the like.

Specific examples of the organic polyvalent imine compound may include N,N'-diphenylmethane-4,4'-bis(1-aziridinecarboxyamide), trimethylolpropane-tri-β-aziridinylpropionate, tetramethylolmethane-tri-β-aziridinylpropionate, N,N'-toluene-2,4-bis(1-aziridinecarboxyamide)triethylenemelamine, and the like.

Examples of the metal chelate-based crosslinking agent include zirconium chelate-based crosslinking agents, such as tri-n-butoxyethyl acetoacetate zirconium, di-n-butoxy bis(ethylacetoacetate)zirconium, n-butoxy tris(ethylacetoacetate)zirconium, tetrakis(n-propylacetoacetate)zirconium, tetrakis(acetylacetoacetate)zirconium, tetrakis(ethylacetoacetate)zirconium, etc.; titanium chelate-based crosslinking agents, such as diisopropoxy bis(ethylaetoaetate)titanium, diisopropoxy bis(acetylacetate)titanium, diisopropoxy bis(acetylacetone)titanium, etc.; aluminum chelate-based crosslinking agents, such as aluminum diisopropoxyethyl acetoacetate, aluminum diisopropoxyacetylacetonate, isopropoxy bis(ethylacetoacetate)aluminum, isopropoxy bis(acetylacetonate)aluminum, tris(ethylacetoacetate)aluminum, tris(acetylacetonate)aluminum, monoacetylacetonate bis(ethylacetoacetate)aluminum, etc.; and the like.

As the crosslinking agent (C), one selected from those enumerated above may be used, or a combination of two or more thereof may also be used.

In the case where the crosslinking agent (C) is blended in the layer containing at least one of the acrylic polymer (A) and the acrylic polymer (B), the crosslinking agent (C) is preferably blended in the content of 0.1 to 20 parts by mass, more preferably blended in the content of 0.2 to 10 parts by mass, and still more preferably blended in the content of 0.5 to 5 parts by mass based on 100 parts by mass of the total amount of the polymer (A) and the polymer (B) in each layer.

[Photopolymerization Initiator (D)]

In the case where the pressure sensitive adhesive layer is energy ray-curable, it is preferred that the pressure sensitive adhesive layer contains a photopolymerization initiator (D). In view of the fact that the pressure sensitive adhesive layer contains the photopolymerization initiator (D), it becomes easy to allow the pressure sensitive adhesive layer to advance energy ray curing with an ultraviolet ray or the like.

Here, in the case where the pressure sensitive adhesive layer is composed of a single layer, and the single-layered pressure sensitive adhesive layer is energy ray-curable, it is preferred to blend the photopolymerization initiator (D) in the pressure sensitive adhesive layer composed of a single layer. On the other hand, in the case where the pressure sensitive adhesive layer is composed of plural layers, with respect to the plural layers, it is preferred to blend the photopolymerization initiator (D) in the layer that is energy ray-curable.

Examples of the photopolymerization initiator (D) include low-molecular weight polymerization initiators, such as acetophenone, 2,2-diethoxybenzophenone, 4-methylbenzophenone, 2,4,6-trimethylbenzophenone, Michler's ketone, benzoin, benzoin methyl ether, benzoin ethyl ether, benzoin isopropyl ether, benzoin isobutyl ether, benzyl diphenyl sulfide, tetramethylthiuram monosulfide, benzyl dimethyl ketal, dibenzil, diacetyl, 1-chloroanthraquinone, 2-chloro anthraquinone, 2-ethylanthraquinone, 2,2-dimethoxy-1,2-diphenylethan-1-one, 1-hydroxycyclohexyl phenyl ketone, 2-methyl-1-[4-(methylthio)phenyl]-2-morpholinopropanone-1,2-benzyl-2-dimethylamino-1-(4-morpholinophenyl)-butanone-1,2-hydroxy-2-methyl-1-phenyl-1-propanone, diethyl thioxanthone, isopropyl thioxanthone, 2,4,6-trimethylbenzoykliphenyl-phosphine oxide, etc.; oligomerized polymerization initiators, such as oligo{2-hydroxy-2-methyl-1-[4-(1-methylvinyl)phenyl]propanone}, etc.; and the like.

As mentioned above, the photopolymerization initiator (D) is a material that is blended in the energy ray-curable layer, and in each layer containing at least one of the polymer (A) and the polymer (B), the photopolymerization initiator (D) is preferably contained in the content of 0.1 to 15 parts by mass, more preferably contained in the content of 0.2 to 10 parts by mass, and still more preferably contained in the content of 0.5 to 5 parts by mass based on 100 parts by mass of the total amount of the polymer (A) and the polymer (B).

The pressure sensitive adhesive layer may further contain, as other components than those mentioned above, a dye, a pigment, a deterioration preventing agent, an antistatic agent, a flame retardant, a silicone compound, a chain transfer agent, a plasticizer, a filler, resin components other than the acrylic polymers (A) and (B), or the like.

In the present invention, by properly regulating the content of at least one of the acrylic polymer (A) and the acrylic polymer (B) in the pressure sensitive adhesive layer, it is possible to regulate the aforementioned gel fraction and number average molecular weight of the sol content. For example, when the amount of the polymer (B) is increased, there is a tendency that not only the gel content is decreased, but also the number average molecular weight of the sol content becomes low. On the other hand, when the amount of the polymer (A) is increased, there is a tendency that not only the gel content is increased, but also the number average molecular weight of the sol content becomes high.

It is also possible to regulate the gel fraction and the number average molecular weight of the sol content by others than the contents of the polymer (A) and the polymer (B). For example, when the molecular weight distribution of the polymer (A) is made small, or the weight average molecular weight thereof is made high, the gel content increases, and the number average molecular weight of the sol content easily becomes high. Similarly, when the molecular weight distribution of the polymer (B) is made low, or the weight average molecular weight thereof is made high, the gel content increases, and the number average molecular weight of the sol content easily becomes high. Furthermore, when the blending amount of the crosslinking agent (C) is increased, there is a tendency that the gel fraction becomes large.

(Layer Structure of Pressure Sensitive Adhesive Layer)

The pressure sensitive adhesive layer has one or more layers having at least one of the polymer (A) and the polymer (B). In the pressure sensitive adhesive layer, it is preferred that one or two or more layers having at least one of the polymer (A) and the polymer (B) are existent, and it is more preferred that two or more layers having at least one of the polymer (A) and the polymer (B) are existent. When two or more layers are existent as such a layer, it becomes easy to make the embedding properties favorable. As for such a layer, when the number of layers is made small, the production of the pressure sensitive adhesive layer becomes easy, and therefore, it is preferred that two layers are existent as such a layer.

The pressure sensitive adhesive layer may have a layer not containing either of the polymer (A) and the polymer (B), but it is preferred that the pressure sensitive adhesive layer does not have such a layer.

Examples of the layer not containing either of the polymer (A) and the polymer (B) include a layer having a pressure sensitive adhesive component other than the polymers (A) and (B). Such a layer is, for example, disposed between layers having at least one of the polymer (A) and the polymer (B).

In the pressure sensitive adhesive layer, in the case where the layer having at least one of the polymer (A) and the polymer (B) is one, both the aforementioned polymer (A) and polymer (B) are contained in the subject one layer. In this case, the pressure sensitive adhesive layer is in general composed of a single layer.

On the other hand, in the case where the layer having at least one of the polymer (A) and the polymer (B) is two or more, though each of those layers may contain both the polymer (A) and the polymer (B), each of those layers may not contain both the polymer (A) and the polymer (B).

In each of the layers containing one of the polymer (A) and the polymer (B) at least, these polymers (A) and (B) serve as a main agent in each of the layers. Namely, the total amount of the polymer (A) and the polymer (B) is typically 50 mass % or more, preferably 60 to 99 mass %, and more preferably 70 to 99 mass % relative to the whole amount of the pressure sensitive adhesive composition in each of the layers constituting the pressure sensitive adhesive layer. The whole amount of the pressure sensitive adhesive composition means the total amount of the components constituting each of the layers in each of the layers of the pressure sensitive adhesive layer. In the case where the pressure sensitive adhesive composition is diluted with a diluent solvent or the like and then is coated, the whole amount of the pressure sensitive adhesive composition means an amount from which the amount of the diluent solvent has been removed.

As mentioned above, each of the layers of the pressure sensitive adhesive layer may be energy ray-curable such that when irradiated with an energy ray, it is cured, or may be non-energy ray-curable such that even when irradiated with an energy ray, it is not cured.

The energy ray-curable layer is a layer containing a compound having an energy ray-polymerizable group. As mentioned above, it is preferred that not only the pressure sensitive adhesive layer contains at least one of the polymer (A) and the polymer (B), but also at least one of the polymers (A) and (B) is energy ray-curable, and it is more preferred that the polymer (B) is energy ray-curable.

In the present invention, it is preferred that an outermost layer of the pressure sensitive adhesive layer is an energy ray-curable. The outermost layer of the pressure sensitive adhesive layer constitutes an adhesive surface to be bonded to an adhered. Therefore, by making the outermost layer energy ray-curable, it becomes easy to make releasability on releasing the semiconductor processing sheet from the adhered favorable.

It is preferred that the outermost layer of the pressure sensitive adhesive layer contains the acrylic polymer (B), and it is preferred that the acrylic polymer (B) is energy ray-curable.

As for the thickness of the energy ray-curable outermost layer, in the case where an inside layer is provided in the inside thereof, it is not necessary for make it large so much, and it is preferably smaller than the total thickness of the inside layer, and it is more preferably ½ or less, and more preferably 1/50 to 1/5 of the total thickness of the inside layer.

The pressure sensitive adhesive layer of the present invention may have a thickness such that the unevenness of the workpiece can be embedded. Namely, in the case where the semiconductor processing sheet is stuck onto the front face of the semiconductor wafer that is provided with a bump, the thickness of the pressure sensitive adhesive layer may be larger than the height of the bump. Specifically, the thickness of the pressure sensitive adhesive layer is preferably 1.0 time or more, more preferably 1.2 to 3 times, and more preferably 1.4 to 2 times of the height of the bump.

The height of the bump as referred to herein refers to a maximum value of the height of the bump provided in the semiconductor wafer.

Specifically, the thickness of the pressure sensitive adhesive layer is preferably 20 to 300 μm, more preferably 30 to 200 μm, and still more preferably 40 to 150 μm.

In the case where the pressure sensitive adhesive layer is composed of a single layer, the thickness of the pressure sensitive adhesive layer means the thickness of the single-layered pressure sensitive adhesive layer. On the other hand, in the case where the pressure sensitive adhesive layer is composed of plural layers, the thickness of the pressure sensitive adhesive layer means the sum total of the thicknesses of the plural layers constituting the pressure sensitive adhesive layer.

It is preferred that the pressure sensitive adhesive layer has at least one layer containing both the polymer (A) and the polymer (B). In view of the fact that the pressure sensitive adhesive layer has a layer containing both the polymer (A) and the polymer (B), it becomes easy to effectively prevent generation of a stain-like residue while making the embedding properties favorable.

It is preferred that the pressure sensitive adhesive layer has a layer which contains both the polymer (A) and the polymer (B) and in which a ratio (A/B) of the content of the polymer (A) to the content of the polymer (B) is 0.7 to 5 (the subject layer will be hereinafter also referred to as "both component-containing layer"). This content ratio (A/B) is more preferably 1 to 3, and still more preferably 1.1 to 2.5.

It is preferred that the pressure sensitive adhesive layer has a layer containing both the polymer (A) and the polymer (B) (specifically, the both component-containing layer), and the subject layer is the inside layer. In that case, it is more preferred that the outermost layer is energy ray-curable, and it is still more preferred that the outermost layer contains the energy ray-curable polymer (B).

On that occasion, the outermost layer may not contain or may contain the polymer (A). However, even in the case where the outermost layer contains the polymer (A), it is preferred that the content ratio (A/B) of the polymer (A) to the polymer (B) of the outermost layer is lower than the content ratio (A/B) of the inside layer (e.g. both component-containing layer). In this way, the outermost layer which does not contain the polymer (A) while containing the polymer (B), or in which the content ratio (A/B) is lower than that of the inside layer that is the both component-containing layer will be hereinafter also referred to as "B component-dominating layer".

In the present invention, even when the outermost layer does not contain the polymer (A) or contains only a small amount of the polymer (A) (namely, even when the outermost layer is the B component-dominating layer), it becomes possible to prevent generation of a stain-like residue due to an effect of the polymer (A) in the inside layer. On the other hand, in view of the fact that the outermost layer contains a lot of the polymer (B), it becomes easy to make the embedding properties or releasability favorable.

In this way, in the case where the inside layer is the both component-containing layer, a ratio (A/B) of the content of the polymer (A) to the content of the polymer (B) in the outermost layer (namely, the B component-dominating layer) is preferably 0 or more and less than 1.5, more preferably 0 or more and less than 1, and still more preferably 0 (namely, the polymer (A) is not contained).

The aforementioned both component-containing layer is not always the inside layer but may constitute the outermost layer. In this case, it is preferred that the pressure sensitive adhesive layer is a single layer.

More specifically, it is preferred that the semiconductor processing sheet has a structure of each of the following first and second embodiments. Of these, it is more preferred that the semiconductor processing sheet has the structure of the second embodiment from the viewpoint of making the embedding properties more favorable.

First Embodiment

In the first embodiment, the pressure sensitive adhesive layer 12 is composed of a single layer as shown in FIG. 1. The pressure sensitive adhesive layer 12 composed of a single layer constitutes the outermost layer and contains both the polymer (A) and the polymer (B). Thus, the pressure sensitive adhesive layer 12 is the both component-containing layer, and the content ratio (A/B) is one mentioned above. It is preferred that the pressure sensitive adhesive layer 12 is energy ray-curable, and it is more preferred that the polymer (B) is energy ray-curable.

In the present embodiment, details of the various materials used for the pressure sensitive adhesive layer 12 are those mentioned above, and the explanation of the details is omitted.

Second Embodiment

In the second embodiment, the pressure sensitive adhesive layer 12 is composed of two layers, e.g. the inside layer 12B and the outermost layer 12A as shown in FIG. 2. In the second embodiment, the inside layer 12B contains both the polymer (A) and the polymer (B). Thus, the inside layer 12B is the both component-containing layer, and the content ratio (A/B) is one explained above.

Although the inside layer 12B may be either energy ray-curable or non-energy ray-curable, it is preferably energy ray-curable. In the case where the inside layer 12B is energy ray-curable, it is preferred that the polymer (B) is energy ray-curable.

In the second embodiment, it is preferred that the outermost layer 12A is energy ray-curable. More specifically, it is preferred that the outermost layer 12A contains the polymer (B), and it is more preferred that such a polymer (B) is energy ray-curable.

That is, in the present embodiment, it is more preferred that not only the inside layer 12B contains both the polymer (A) and the polymer (B), but also the outermost layer 12A contains the polymer (B), and the polymer (B) of the inside layer and the outermost layer are energy ray-curable.

In the second embodiment, though the outermost layer 12A may contain, in addition to the polymer (B), the polymer (A), it is more preferred that the outermost layer 12A does not contain the polymer (A). Even in the case where the outermost layer 12A contains the polymer (A), the content ratio (AB) in the outermost layer 12A is lower than that in the inside layer 12B. That is, in the second embodiment, it is more preferred that the inside layer 12B is the both component-containing layer, and the outermost layer 12A is the B component-dominating layer. Even in this case, it is especially preferred that the polymer (B) in the inside layer and the outermost layer is energy ray-curable. Details of the content ratio (A/B) in the B component-dominating layer are those mentioned above.

In the first and second embodiments, details of the various materials which are used for the inside layer 12B and the outermost layer 12A are those mentioned above, and the explanation thereof is omitted.

In the second embodiment, the thickness of the pressure sensitive adhesive layer 12 (namely, the total thickness of the outermost layer 12A and the inside layer 12B) is one mentioned above. The thickness of the outermost layer 12A is preferably smaller than the thickness of the inside layer 12B and is more preferably ½ or less, and still more preferably 1/50 to 1/5 of the thickness of the inside layer 12B.

<Base Material>

Although the base material which is used for the semiconductor processing sheet is not particularly limited, it is preferably a resin film. As compared with papers or nonwoven fabrics, the resin film is few in generation of a dust, and therefore, it is suitable for a processing member of electronic parts and is easily available.

The base material may be a single-layered film made of one resin film or may be a plural-layered film made of a laminate of plural resin films.

Examples of the resin film which is used as the base material include a polyolefin-based film, a vinyl halide polymer-based film, an acrylic resin-based film, a rubber-based film, a cellulose-based film, a polyester-based film, a polycarbonate-based film, a polystyrene-based film, a polyphenylene sulfide-based film, a cycloolefin polymer-based film, a film of a cured material of a urethane resin-containing energy ray-curable composition, a film of an ionomer, and the like.

Among these, a polyester-based film is preferred from the viewpoint that it is relatively high in rigidity and is able to stably hold a pressure sensitive adhesive layer or a workpiece, or the like.

Specifically, examples of the polyester-based film include films of a polyester, such as polyethylene terephthalate, polyethylene isophthalate, polybutylene terephthalate, polyethylene-2,6-naphthalene dicarboxylate, etc.

The polyester-based film may also be a resin-mixed film of a mixture of the aforementioned polyester and a relatively small amount of other resin.

Among these polyester-based films, a polyethylene terephthalate (PET) film is preferred from the viewpoints of easiness of availability and high thickness precision. A multi-layered film of a laminate of a polyester-based film, such as a PET film, etc., with any one of a polyolefin-based film and an acrylic resin-based film is also preferred.

Examples of the film of a cured material of a urethane resin-containing energy ray-curable composition include a film of a urethane acrylate-containing energy ray-curable composition (hereinafter also referred to as "urethane acrylate film").

Suitable specific examples of the base material include a single-layered film composed of a PET film, a three-layered film composed of a polyolefin-based film/PET film/polyolefin-based film, and a two-layered film composed of PET film/urethane acrylate film.

From the viewpoint of giving appropriate elasticity to the semiconductor processing sheet, the thickness of the base material is preferably 10 to 250 μm, more preferably 20 to 200 μm, and still more preferably 30 to 150 μm. It is desired to properly set the thickness of the base material in conformity with the shape or height of the bump along with the thickness of the pressure sensitive adhesive layer.

The base material may contain a filler, a coloring agent, an antistatic agent, an antioxidant, an organic lubricant, a catalyst, or the like within a range where the effect of the present invention is not impaired. The base material may be either transparent or opaque. However, in the case where the pressure sensitive adhesive layer has an energy ray-curable layer, the base material is preferably one capable of transmitting therethrough an energy ray sufficient for curing the pressure sensitive adhesive layer.

The semiconductor processing sheet may be properly provided between the pressure sensitive adhesive layer and the base material with a primer layer, an easily adhesive layer, a buffer layer, other pressure sensitive adhesive layer than the aforementioned pressure sensitive adhesive layer, or the like. Examples of the buffer layer include a layer formed of urethane acrylate, and the like.

The other pressure sensitive adhesive layer than the aforementioned pressure sensitive adhesive layer is a layer in which the gel fraction thereof falls outside the aforementioned range, or the number average molecular weight of the sol content thereof falls outside the aforementioned range and is in which, when the gel fraction and the number average molecular weight of the sol content are measured together with the aforementioned pressure sensitive adhesive layer, the measured values fall outside the foregoing ranges.

<Release Material>

The pressure sensitive adhesive layer may be protected by sticking a release material onto the surface (e.g. outermost surface) of the pressure sensitive adhesive layer of the semiconductor processing film. As the release material, a release film in which the both surfaces thereof are subjected to a release treatment, a release film, in which one surface thereof is subjected to a release treatment, or the like is used. Examples thereof include one resulting from coating a release agent on a base material for release material, and the like. The release material is stuck onto the pressure sensitive adhesive layer such that the release treated surface thereof comes into contact with the surface of the pressure sensitive adhesive layer.

Examples of the base material for release material include plastic films, such as films of a polyester resin, e.g., a polyethylene terephthalate resin, a polybutylene terephthalate resin, a polyethylene naphthalate resin, etc.; films of a polyolefin resin, e.g., a polypropylene resin, a polyethylene resin, etc.; and so on. Examples of the release agent include a silicone-based resin, an olefin-based resin, a rubber-based elastomer such as an isoprene-based resin and a butadiene-based resin, etc., a long-chain alkyl-based resin, an alkydbased resin, a fluorine-based resin, and the like, with a silicone-based resin being preferred.

Although the thickness of the release material is not particularly limited, it is preferably 5 to 200 μm, more preferably 10 to 120 μm, and still more preferably 15 to 80 μm.

[Production Method of Semiconductor Processing Sheet]

In the production method of the semiconductor processing sheet of the present invention, the pressure sensitive adhesive layer is formed on one surface of the base material to produce the semiconductor processing sheet.

In the present production method, at least the acrylic polymer (A) and the acrylic polymer (B) are blended in the pressure sensitive adhesive layer such that the pressure sensitive adhesive layer has the aforementioned characteristics. As mentioned above, the acrylic polymer (A) and the acrylic polymer (B) are obtained through living radical polymerization and free radical polymerization, respectively, and details thereof are those mentioned above.

In the case where the pressure sensitive adhesive layer is composed of a single layer, a pressure sensitive adhesive composition containing, in addition to the polymers (A) and (B), other compounds to be blended, if desired (e.g., the crosslinking agent (C), the photopolymerization initiator (D), and other components), or a dilution of the pressure sensitive adhesive composition resulting from diluting the pressure sensitive adhesive composition with a diluent solvent is first prepared.

Examples of the diluent solvent include organic solvents, such as methyl ethyl ketone, acetone, ethyl acetate, tetrahydrofuran, dioxane, cyclohexane, n-hexane, toluene, xylene, n-propanol, isopropanol, etc. As such an organic solvent, the organic solvent used when synthesizing the polymer (A) or (B) may be used as it is, or one or more other organic solvent may be added thereto.

Then, the pressure sensitive adhesive composition or the dilution thereof is coated on the base material and optionally heated for drying to form a pressure sensitive adhesive layer on the base material. Alternatively, the pressure sensitive adhesive composition or the dilution thereof is coated on the release treated surface of the release material and optionally heated for drying to form a pressure sensitive adhesive layer on the release material, followed by bonding the pressure sensitive adhesive layer on the release material and the base material, thereby producing a semiconductor processing sheet having the pressure sensitive adhesive layer and the release material provided in this order on the base material.

On the other hand, in the case where the pressure sensitive adhesive layer is composed of plural layers, a pressure sensitive adhesive composition or a dilution thereof corresponding to the composition of each of the layers is first prepared. Subsequently, each of the pressure sensitive adhesive layers is successively formed on the base material using the subject pressure sensitive adhesive composition or dilution thereof, thereby obtaining the pressure sensitive adhesive layer.

On this occasion, each layer (e.g. outermost layer or inside layer) constituting the pressure sensitive adhesive layer may be formed by coating the pressure sensitive adhesive composition or dilution thereof on the base material or a layer (e.g. inside layer) formed on the base material and optionally heating for drying. However, a method in which the pressure sensitive adhesive composition or dilution thereof is once coated on the release material and optionally heated for drying, and the respective layers formed on the release material are successively stuck onto the base material side is preferred. On this occasion, the release material may be properly removed after sticking the respective layers onto the base material side.

The pressure sensitive adhesive composition can be coated by a known coating method. Examples of the coating method include a spin coating method, a spray coating method, a bar coating method, a knife coating method, a roll coating method, a blade coating method, a die coating method, a gravure coating method, and the like. In the case where the pressure sensitive adhesive composition is made to be a dilution with a diluent solvent, it is preferred that after coating it, the resultant is subjected to a drying treatment by heating at a temperature of 80 to 150° C. for 30 seconds to 5 minutes.

In the case where the pressure sensitive adhesive composition contains a crosslinking agent, after coating and drying, an ageing period for accomplishing the crosslinking reaction may be provided. Specifically, it is preferred to provide an ageing period in which the coated material is allowed to stand in an environment at 23° C. and at a relative humidity of 50% for about 7 days to accomplish the crosslinking reaction.

[Use Method of Semiconductor Processing Sheet]

The semiconductor processing sheet of the present invention is used in such a manner that on processing a semiconductor wafer, it is stuck onto a workpiece, such as a semiconductor wafer, etc., through the pressure sensitive adhesive layer. In the case where a release material is further provided on the pressure sensitive adhesive layer, after the release material is removed, the semiconductor processing sheet is stuck onto a workpiece, such as a semiconductor wafer, etc. On sticking the semiconductor processing sheet onto a workpiece, such as a semiconductor wafer, etc., though its temperature is not particularly limited, it is, for example, 40 to 90° C., and preferably 50 to 80° C.

The semiconductor processing sheet is used upon being stuck onto the uneven surface of a workpiece, and is preferably used upon being stuck onto a front face of a semiconductor wafer that has plural bumps provided thereon.

The semiconductor processing sheet of the present invention is one for protecting a workpiece on processing the semiconductor wafer. The semiconductor processing sheet of the present invention is good in the embedding properties to unevenness or a bump, and therefore, it is possible to appropriately protect the workpiece. The semiconductor processing sheet is released from the workpiece after use, and on that occasion the generation of a stain-like residue in the workpiece is prevented in the present invention.

In the present invention, in the case where the pressure sensitive adhesive layer has an energy ray-curable layer, the semiconductor processing sheet stuck onto a workpiece, such as a semiconductor wafer, etc., is irradiated with an energy ray thereby curing the pressure sensitive adhesive layer before being released from the workpiece. In view of the fact that the pressure sensitive adhesive layer is cured, its adhesion to the semiconductor wafer is decreased, so that the semiconductor processing sheet is easily released from the semiconductor wafer. Examples of the energy ray include an ultraviolet ray, an electron beam, a laser beam, an α-ray, a β-ray, a γ-ray, and an X-ray. From the viewpoints of easiness of control, multiplicity, and the like, it is preferred to use an ultraviolet ray.

It is preferred that the semiconductor processing sheet of the present invention is used as a back grind sheet to be stuck onto the front face of the semiconductor wafer when the back face of the semiconductor wafer is ground. In view of the fact that the semiconductor processing sheet is used as a back grind sheet, it is possible to appropriately protect the front face of the semiconductor wafer at the time of back grinding while preventing the generation of a stain-like residue.

EXAMPLES

The present invention is hereunder described in more detail based on Examples, but it should be construed that the present invention is by no means limited by these Examples.

In the present invention, specific measurement methods and evaluation methods are as follows.

As respective test pieces having a pressure sensitive adhesive layer as used in the measurement and evaluation, those resulting from coating and drying a pressure sensitive adhesive composition and then aging in an environment at 23° C. and at a relative humidity of 50% for 7 days were used.

<Weight Average Molecular Weight (Mw), Number Average Molecular Weight (Mn), and Molecular Weight Distribution (Mw/Mn)>

The measurement was performed using a gel permeation chromatograph (product name: HLC-8020, manufactured by Tosoh Corporation) under the following conditions, and values in terms of standard polystyrene were adopted.
(Measurement Conditions)
Column: "TSK guard column HXL-H", "TSK gel GMHXL (×2)", "TSK gel G2000MHXL" (all manufactured by Tosoh Corporation)
Column temperature: 40° C.
Developing solvent: THF
Flow rate: 1.0 mL/min
<Gel Fraction>

In the case where the pressure sensitive adhesive layer was composed of a single layer, a pressure sensitive adhesive composition was coated on a release film and dried, and was then stuck onto another release film, thereby obtaining a pressure sensitive adhesive layer for measuring gel fraction in a state where the single-layered pressure sensitive adhesive layer was sandwiched between the two release sheets.

In the case where the pressure sensitive adhesive layer was composed of two layers, a single-layered pressure sensitive adhesive layer was firstly formed on a release film similar to the above. Thereafter, a pressure sensitive adhesive composition constituting a next layer was coated on another release film and dried to form a pressure sensitive adhesive layer on the release film, and the resulting pressure sensitive adhesive layer was stuck on the pressure sensitive adhesive layer firstly formed on the release film, thereby obtaining a pressure sensitive adhesive layer for measuring gel fraction in a state where it was sandwiched between the two release films. In the case where the pressure sensitive adhesive layer is composed of three layers or more, the release film stuck onto the pressure sensitive adhesive layer is released, and the same operations are repeated.

The thickness of each of the layers in the aforementioned pressure sensitive adhesive layer for measuring gel fraction was regulated so as to have the same thickness of each of the layers in the Examples and Comparative Examples. A dilution concentration with an organic solvent and conditions of coating and drying by heating were also regulated so as to have those the same as in the Examples and Comparative Examples.

The obtained pressure sensitive adhesive layer for measuring gel fraction was cut in a size of 50 mm×100 mm; the release films stuck onto the both surfaces of the pressure sensitive adhesive layer were removed; the pressure sensitive adhesive layer was wrapped by nylon mesh (mesh size: 200) having a size of 100 mm×150 mm; the mass of the pressure sensitive adhesive and the nylon mesh was weighed with a precision balance; and the mass of the nylon mesh having been measured in advance was reduced from the weighed mass, thereby obtaining a mass of only the pressure sensitive adhesive. The mass at this time was designated as W1.

Subsequently, the pressure sensitive adhesive wrapped by the aforementioned nylon mesh was dipped in 100 g of THF at 23° C. for 7 days. Thereafter, the pressure sensitive adhesive was taken out, dried at 120° C. for one hour, and subsequently allowed to stand under conditions at a temperature of 23° C. and a relative humidity of 50% for one hour so as to control the humidity. Thereafter, the mass of the pressure sensitive adhesive and the nylon mesh was weighed with a precision balance, and the mass of the nylon mesh having been measured in advance was reduced from the weighed mass, thereby obtaining a mass of only the pressure sensitive adhesive. The mass at this time was designated as W2. The gel fraction was determined according to (W2/W1)×100 (%).

[Molecular Weight Evaluation of Sol Content]

Using the THF solution after the aforementioned evaluation of gel fraction, the number average molecular weight (Mn) was measured under the aforementioned measurement conditions, and the number average molecular weight of the sol content was determined.

<Embedding Properties>

The release sheet of the semiconductor processing sheet was removed to allow the pressure sensitive adhesive layer to expose, and the semiconductor processing sheet was stuck onto the front face of a bump-provided wafer (bump diameter: 100 µm, bump pitch: 200 µm, bump height: 50 µm), on which the bumps were formed, at a sticking temperature of 60° C. and a sticking rate of 20 mm/s using a sticking apparatus (product name: RAD-3510, manufactured by Lintec Corporation) through the pressure sensitive adhesive layer.

Then, the diameters of five air bubbles around the bumps of the bump-provided wafer after sticking the semiconductor processing sheet were measured with an optical microscope. The embedding properties to unevenness of the semiconductor processing sheet were evaluated in terms of an average value of the diameters according to the following criteria.

A: The diameter of air bubbles was less than 162 µm.
B: The diameter of air bubbles was 162 µm or more and less than 165 µm.
C: The diameter of air bubbles was 165 µm or more.

<Stain-Like Residue>

On a silicon mirror wafer, a release film (trade name: SP-PET381031, manufactured by Lintec Corporation, thickness: 38 µm) cut in a size of 10 mm square was placed such that a non-release treated surface came into contact with the wafer, onto which the semiconductor processing sheet was then stuck. The resultant was allowed to stand under light shielding for 8 hours and then irradiated with an ultraviolet ray (230 mW/cm$^2$, 380 mJ/cm$^2$) using a UV irradiation apparatus (product name: RAD2000M/12, manufactured by Lintec Corporation), followed by releasing the semiconductor processing sheet.

Subsequently, the place in which the aforementioned release film had existed was observed with an electron microscope (scanning electron microscope "VE-9800", manufactured by Keyence Corporation). The presence or absence of the stain-like residue was judged from a difference in tint between an unstuck portion and a stuck portion of the semiconductor processing sheet.

The case where the stain-like residue was not observed was evaluated as "A", and the case where the stain-like residue was observed was evaluated as "C".

<Releasability Evaluation>

In the aforementioned stain-like residue test, the releasability on releasing the semiconductor processing sheet was also evaluated. The case where the resistance on releasing was small, and the semiconductor processing sheet could be easily released was evaluated as "A"; the case where the resistance on releasing was an intermediate degree, and the semiconductor processing sheet could be released without a problem was evaluated as "B"; and the case where the resistance on releasing was large, and the semiconductor processing sheet could not be easily released was evaluated as "C".

The acrylic polymers (A) and (B) used in the Examples and Comparative Examples are as follows.

[Acrylic Polymer (A)]

Acrylic Polymers (A-1) and (A-2)

Acrylic copolymer obtained through copolymerization of n-butyl acrylate (BA), N,N-dimethyl acrylamide (DMAA), methyl methacrylate (MMA), and acrylic acid (AA) in a proportion of 80/18/0.2/1.8 in terms of a mass ratio by living radical polymerization Acrylic Polymer (A-3)

Acrylic copolymer obtained through copolymerization of n-butyl acrylate (BA) and acrylic acid (AA) in a proportion of 85/15 in terms of a mass ratio by living radical polymerization

[Acrylic Polymer (B)]

Acrylic Polymer (B-1)

Energy ray-curable acrylic polymer produced by copolymerizing n-butyl acrylate (BA) and 2-hydroxyethyl acrylate (HEA) in a proportion of 85/15 in terms of a mass ratio by free radical polymerization to obtain an acrylic copolymer and then allowing 80 mol % of hydroxyl groups in a side chain of the obtained acrylic copolymer to react with methacryloyloxyethyl isocyanate (MOI)

Acrylic Polymer (B-2)

Acrylic polymer obtained through copolymerization of butyl acrylate (BA) and 2-hydroxyethyl acrylate (HEA) in a proportion of 85/15 in terms of a mass ratio by free radical polymerization The crosslinking agent (C) and the photopolymerization initiators (D) used in the Examples and Comparative Examples are as follows.

Crosslinking Agent (C-1):

Tolylene diisocyanate-based crosslinking agent (product name: CORONATE L, manufactured by Tosoh Corporation)

Photopolymerization Initiator (D-1):

2,2-Dimethoxy-1,2-diphenylethan-1-one (product name: IRGACURE 651, manufactured by BASF SE)

Photopolymerization Initiator (D-2):

2,4,6-Trimethylbenzoyl diphenyl phosphine oxide (product name: IRGACURE TPO, manufactured by BASF SE)

Physical properties of the acrylic polymers (A) and (B) used in the Examples and Comparative Examples are shown in the following Table 1.

TABLE 1

| | Kind | Formulation | Mw | Mw/Mn | Polymerization method |
|---|---|---|---|---|---|
| Acrylic polymer (A) | A-1 | BA/DMAA/MMA/ AA = 80/18/0.2/1.8 | 400000 | 1.29 | Living |
| | A-2 | BA/DMAA/MMA/ AA = 80/18/0.2/1.8 | 200000 | 2.03 | Living |
| | A-3 | BA/AA = 85/15 | 800000 | 1.53 | Living |
| Acrylic polymer (B) | B-1 | BA/HEA(MOI) = 85/15(80) | 300000 | 4.63 | Free |
| | B-2 | BA/HEA = 85/15 | 400000 | 4.08 | Free |

Example 1

A diluted solution obtained by diluting a pressure sensitive agent composition composed of 60 parts by mass of the acrylic polymer (A-1), 40 parts by mass of the acrylic polymer (B-1), 1.35 parts by mass of the crosslinking agent (C-1), 2.4 parts by mass of the initiator (D-1), and 0.2 parts by mass of the initiator (D-2) with toluene in a concentration 30 mass % was coated on a release film (product name: SP-PET381031, manufactured by Lintec Corporation, thickness: 38 μm) with a the coater and then dried by heating under conditions at 100° C. for 3 minutes, thereby forming a pressure sensitive adhesive layer (thickness: 50 μm) constituting an inside layer on the release film. Thereafter, a PET film (product name: A-4100, manufactured by Toyobo Co., Ltd.) working as a base material was stuck onto the pressure sensitive adhesive layer, thereby obtaining a first laminate composed of base material/pressure sensitive adhesive layer (e.g. inside layer)/release film.

Thereafter, a diluted solution obtained by diluting a pressure sensitive agent composition composed of 100 parts by mass of the acrylic polymer (B-1), 1.35 parts by mass of the crosslinking agent (C-1), 2.4 parts by mass of the initiator (D-1), and 0.2 parts by mass of the initiator (D-2) with toluene in a concentration 30 mass % was coated on a release film (product name: SP-PET381031, manufactured by Lintec Corporation) that was separately prepared with a die coater and then dried by heating under conditions at 100° C. for one minute, thereby forming a pressure sensitive adhesive layer (thickness: 5 μm) constituting an outermost layer on the release film. There was thus obtained a second laminate composed of pressure sensitive adhesive layer (e.g. outermost layer)/release film.

Subsequently, while releasing the release film of the first laminate, the surface of the inside layer was stuck onto the surface of the outermost layer, thereby obtaining a semiconductor processing sheet composed of base material/inside layer/outermost layer/release film.

Example 2

The same procedures as in Example 1 were carried out, except that the blending of the pressure sensitive adhesive composition for forming an inside layer was changed as shown in Table 2.

Example 3

A diluted solution obtained by diluting a pressure sensitive adhesive composition composed of 60 parts by mass of the acrylic polymer (A-1), 40 parts by mass of the acrylic polymer (B-1), 1.35 parts by mass of the crosslinking agent (C-1), 2.4 parts by mass of the initiator (D-1), and 0.2 parts by mass of the initiator (D-2) with toluene in a concentration 30 mass % was coated on a release film (product name: SP-PET381031, manufactured by Lintec Corporation) with a die coater and then dried by heating under conditions at 100° C. for 3 minutes, thereby forming a pressure sensitive adhesive layer (e.g. outermost layer) (thickness: 55 μm) on the release film. Thereafter, a PET film (product name: A-4100, manufactured by Toyobo Co., Ltd.) working as a base material was stuck onto the pressure sensitive adhesive layer, thereby obtaining a semiconductor processing sheet composed of base material/pressure sensitive adhesive layer (e.g. outermost layer)/release film.

Example 4

The same procedures as in Example 3 were carried out, except that the blending of the pressure sensitive adhesive composition for forming a pressure sensitive adhesive layer (e.g. outermost layer) was changed as shown in Table 2.

Comparative Examples 1 and 7

The same procedures as in Example 3 were carried out, except that the blending of the pressure sensitive adhesive composition for forming a pressure sensitive adhesive layer (e.g. outermost layer) was changed as shown in Table 2.

Comparative Examples 2 to 6

The same procedures as in Example 1 were carried out, except that the blending of the pressure sensitive adhesive composition for forming an inside layer was changed as shown in Table 2.

TABLE 2

|  | Outermost layer | | | | | Inside layer | | | | | | |
|---|---|---|---|---|---|---|---|---|---|---|---|---|
|  | Acrylic polymer (A) | | Acrylic polymer (B) | | Crosslinking agent (C-1) | Initiator (D) | | Acrylic polymer (A) | | Acrylic polymer (B) | | Crosslinking agent (C-1) | Initiator (D) | |
|  | Type | Parts by mass | Type | Parts by mass | Parts by mass | D-1 Parts by mass | D-2 Parts by mass | Type | Parts by mass | Type | Parts by mass | Parts by mass | D-1 Parts by mass | D-2 Parts by mass |
| Example 1 | — | — | B-1 | 100 | 1.35 | 2.4 | 0.2 | A-1 | 60 | B-1 | 40 | 1.35 | 2.4 | 0.2 |
| Example 2 | — | — | B-1 | 100 | 1.35 | 2.4 | 0.2 | A-2 | 60 | B-1 | 40 | 1.35 | 2.4 | 0.2 |
| Example 3 | A-1 | 60 | B-1 | 40 | 1.35 | 2.4 | 0.2 | — | — | — | — | — | — | — |
| Example 4 | A-3 | 60 | B-1 | 40 | 1.35 | 2.4 | 0.2 | — | — | — | — | — | — | — |
| Comparative Example 1 | — | — | B-1 | 100 | 1.35 | 2.4 | 0.2 | — | — | — | — | — | — | — |
| Comparative Example 2 | — | — | B-1 | 100 | 1.35 | 2.4 | 0.2 | — | — | B-2 | 100 | 1.35 | 2.4 | 0.2 |
| Comparative Example 3 | — | — | B-1 | 100 | 1.35 | 2.4 | 0.2 | A-1 | 100 | — | — | 1.35 | 2.4 | 0.2 |
| Comparative Example 4 | — | — | B-1 | 100 | 1.35 | 2.4 | 0.2 | A-2 | 100 | — | — | 1.35 | 2.4 | 0.2 |
| Comparative Example 5 | — | — | B-1 | 100 | 1.35 | 2.4 | 0.2 | A-3 | 100 | — | — | 1.35 | 2.4 | 0.2 |
| Comparative Example 6 | — | — | B-1 | 100 | 1.35 | 2.4 | 0.2 | — | — | B-1 | 100 | 1.35 | 2.4 | 0.2 |
| Comparative Example 7 | A-1 | 100 | — | — | 1.35 | 2.4 | 0.2 | — | — | — | — | — | — | — |

The results of Examples 1 to 4 and Comparative Examples 1 to 7 are shown in the following Table 3.

TABLE 3

|  | Layer structure | | | | | | |
|---|---|---|---|---|---|---|---|
|  | Outermost layer | Inside layer | Gel fraction % | Sol content Mn | Embedding properties | Stain-like residue | Releasability |
| Example 1 | B-1 | A-1, B-1 | 65 | 97000 | A | A | A |
| Example 2 | B-1 | A-2, B-1 | 51 | 72000 | A | A | A |
| Example 3 | A-1, B-1 | — | 70 | 70000 | B | A | A |
| Example 4 | A-3, B-1 | — | 67 | 68000 | B | A | A |
| Comparative Example 1 | B-1 | — | 62 | 42000 | A | C | A |
| Comparative Example 2 | B-1 | B-2 | 60 | 32000 | A | C | A |
| Comparative Example 3 | B-1 | A-1 | 88 | 100000 | C | A | A |
| Comparative Example 4 | B-1 | A-2 | 84 | 85000 | C | A | A |
| Comparative Example 5 | B-1 | A-3 | 82 | 90000 | C | A | A |
| Comparative Example 6 | B-1 | B-1 | 62 | 40000 | A | C | A |
| Comparative Example 7 | A-1 | — | 92 | 100000 | C | A | C |

As shown in the foregoing Examples 1 to 4, the gel fraction of the pressure sensitive adhesive layer was set to the predetermined range, and the number average molecular weight of the sol content was made to be high by using the acrylic polymer (A) having a low molecular weight distribution and the acrylic polymer (B) having a high molecular weight distribution for the pressure sensitive adhesive layer, and therefore, the generation of a stain-like residue could be suppressed while making the embedding properties of bumps favorable. Furthermore, the releasability on releasing the semiconductor processing sheet from the semiconductor wafer also became favorable.

On the other hand, in Comparative Examples 1 to 7, the gel fraction of the pressure sensitive adhesive layer fell outside the predetermined range, or the number average molecular weight of the sol content became low, and therefore, the generation of a stain-like residue could not be suppressed with making the embedding properties of bumps favorable.

REFERENCE SIGNS LIST

10: Semiconductor processing sheet
11: Base material
12: Pressure sensitive adhesive layer
12A: Outermost layer
12B: Inside layer

The invention claimed is:
1. A semiconductor processing sheet, comprising:
a base material; and
a pressure sensitive adhesive layer provided on a surface of the base material,
wherein:
the pressure sensitive adhesive layer comprises an outermost layer and an inside layer provided in the inside of the outermost layer;
the pressure sensitive adhesive layer comprises an acrylic polymer (A) having a molecular weight distribution of 3.0 or less and an acrylic polymer (B) having a molecular weight distribution of more than 3.0;
the inside layer is a layer which comprises the acrylic polymer (A) and the acrylic polymer (B) and in which a ratio (A/B) of the content of the polymer (A) to the content of the polymer (B) is 1 to 3;
the outermost layer is a layer which comprises the acrylic polymer (B) and the acrylic polymer (A) and in which the content ratio (A/B) is less than 1 or the outermost layer is a layer which comprises the acrylic polymer (B) and does not comprise the acrylic polymer (A); and
a gel fraction of the pressure sensitive adhesive layer is 50 to 70%, and a number average molecular weight of a sol content of the pressure sensitive adhesive layer is 60,000 or more.

2. The semiconductor processing sheet according to claim 1, wherein the outermost layer of the pressure sensitive adhesive layer is energy ray-curable.

3. The semiconductor processing sheet according to claim 2, wherein the acrylic polymer (B) in the outermost layer is energy ray-curable.

4. The semiconductor processing sheet according to claim 1, wherein the acrylic polymer (A) is an acrylic copolymer (a) resulting from copolymerization of at least an alkyl (meth)acrylate (a1) and a functional group-containing monomer (a2).

5. The semiconductor processing sheet according to claim 4, wherein the functional group-containing monomer (a2) is a monomer containing a carboxyl group.

6. The semiconductor processing sheet according to claim 1, wherein the acrylic polymer (B) contains an acrylic copolymer (b) resulting from copolymerization of at least an alkyl (meth)acrylate (b1) and a functional group-containing monomer (b2), or an energy ray-curable acrylic polymer (Be) having an energy ray-polymerizable group introduced into a side chain of the acrylic copolymer (b).

7. The semiconductor processing sheet according to claim 1, wherein a weight average molecular weight of the acrylic polymer (A) is 150,000 or more, and a weight average molecular weight of the acrylic polymer (B) is 150,000 or more.

8. The semiconductor processing sheet according to claim 1, wherein the outermost layer comprises the acrylic polymer (B) and does not comprise the acrylic polymer (A).

9. The semiconductor processing sheet according to claim 1, wherein the outermost layer comprises the acrylic polymer (A) and the acrylic polymer (B), and the content ratio (A/B) in the outermost layer is less than 1.

10. The semiconductor processing sheet according to claim 1, which is a back grind sheet.

11. A method of producing the semiconductor processing sheet according to claim 1, the method comprising:
forming the pressure sensitive adhesive layer on the surface of the base material,
wherein the pressure sensitive adhesive layer is blended with at least the acrylic polymer (A), which is obtained through living radical polymerization, and the acrylic polymer (B), which is obtained through free radical polymerization, such that the gel fraction of the pressure sensitive adhesive layer is 50 to 70%, and the number average molecular weight of the sol content of the pressure sensitive adhesive layer is 60,000 or more.

* * * * *